(12) United States Patent
Lin et al.

(10) Patent No.: US 7,811,923 B2
(45) Date of Patent: Oct. 12, 2010

(54) INTEGRATED WAFER PROCESSING SYSTEM FOR INTEGRATION OF PATTERNABLE DIELECTRIC MATERIALS

(75) Inventors: Qinghuang Lin, Yorktown Heights, NY (US); Sampath Purushothaman, Yorktown Heights, NY (US); Robert Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 459 days.

(21) Appl. No.: 11/778,876

(22) Filed: Jul. 17, 2007

(65) Prior Publication Data
US 2009/0023284 A1   Jan. 22, 2009

(51) Int. Cl.
*H01L 21/4763* (2006.01)
(52) U.S. Cl. ............... 438/618; 257/E21.497; 392/416
(58) Field of Classification Search ................. 438/618; 257/E21.497; 392/416
See application file for complete search history.

(56) References Cited

U.S. PATENT DOCUMENTS

| 6,051,282 | A  | * | 4/2000 | Konjuh et al. ............... 427/539 |
| 6,838,115 | B2 | * | 1/2005 | Kumar et al. ................ 427/58 |
| 2003/0113974 | A1 | * | 6/2003 | Ning et al. ................. 438/379 |
| 2004/0151893 | A1 | * | 8/2004 | Kydd et al. ................. 428/323 |
| 2005/0116357 | A1 | * | 6/2005 | Fitzsimmons et al. ........ 257/787 |

OTHER PUBLICATIONS

Low Dielectric Constant SILK films as Bottom Antireflective Coating Layers for both KrF and ArF lithography, Microprocesses and Nanotechnology Conference, 2001 International pp. 132-133.*

* cited by examiner

*Primary Examiner*—Matthew C Landau
*Assistant Examiner*—Sonya D McCall-Shepard
(74) *Attorney, Agent, or Firm*—Connolly Bove Lodge & Hutz LLP; Qinghuang Lin

(57) ABSTRACT

The present disclosure relates to an integrated wafer processing apparatus for fabricating semiconductor chips. This integrated wafer processing system combines the lithography patterning steps and irradiation curing steps of the patternable dielectric into one system. The patternable low-k material of the present disclosure also functions as a photoresist, i.e. is a photo-patternable low-k dielectric material.

21 Claims, 3 Drawing Sheets

INTEGRATED WAFER PROCESSING SYSTEM FOR INTEGRATION OF PATTERNABLE DIELECTRIC MATERIALS

TECHNICAL FIELD

The present disclosure relates generally to semiconductor manufacturing equipment and methods for its use. In particular, it relates to an integrated wafer processing apparatus for fabricating semiconductor chips using a patternable dielectric material as an on-chip electrical insulator. This integrated wafer processing system integrates the lithography patterning steps and irradiation curing steps of the patternable dielectric into one system.

BACKGROUND

Computers and electronic equipment of all types rely on integrated circuits. An integrated circuit, also known as IC or microcircuit, is a miniaturized electronic circuit, which is made of mainly semiconductive devices and passive compents that have been manufactured in the surface of a thin substrate of semiconductor material. Semiconductor devices include a plurality of circuits connected to form a more complex integrated circuit and often contain millions of transistors and other circuit elements fabricated on a single silicon crystal semiconductor device. For the device to be functional, a complex network of signal paths will normally be routed to connect the circuit elements distributed on the surface of the device. Efficient routing of these signals across the device can become more difficult as the complexity and number of the integrated circuits is increased. Thus, the formation of multi-level or multi-layered interconnection schemes such as, for example, dual damascene wiring structures, have become more popular due to their efficacy in providing high speed signal routing patterns between large numbers of transistors on a complex semiconductor chip.

When fabricating integrated circuit wiring with a multi-layered scheme, an insulating or dielectric material such as silicon oxide or other low dielectric (low-k) constant insulators are normally patterned with several thousand openings to create conductive line openings and/or via openings using photo patterning and plasma etching techniques such as photolithography with subsequent etching by plasma processes. These via openings are typically filled with a conductive metal material such as aluminum, copper, etc., to interconnect the active and/or passive elements of the integrated circuits. The semiconductor device is then polished to level its surface.

In some instances, a continuous cap layer is then deposited over the planarized surface featuring the dielectric material and conductive metal material. Next, a dielectric material is deposited over the continuous cap layer, via and conductive line openings are created within the dielectric layer as before, another conductive metal material is deposited within the openings and another continuous cap layer is deposited thereon. The process is repeated to fabricate a multi-layer interconnect wiring system. This multi-layer interconnect wiring system is fabricated using a variety of apparatuses including, for example, an apparatus for film deposition, photolithography, reactive ion etching, copper plating, chemical-mechanical polishing, etc. The process to fabricate the multi-layer interconnect system resulting from these steps is called a dual damascene integration scheme.

This dual damascene integration scheme is cumbersome and constitutes a significant part of the manufacturing cost of advanced semiconductor chips having many layers. Many sacrificial films are required to pattern and protect the fragile interlayer dielectric films from damage during plasma and wet processing. These sacrificial patterning and protective films have to be removed after patterning and copper plating, which is time consuming and wasteful. To circumvent these drawbacks, materials that incorporate the properties of both the photoresist and the dielectric materials are highly desirable. This combination material, called photo-patternable low-k dielectric, acts as a photoresist during the lithographic patterning process. It is subsequently converted into a low-k material during post patterning cure. The post patterning cure of the photo-patternable low-k dielectric material removes unwanted organic components and/or sacrificial pore generator (porogens) and forms a more mechanically robust molecular network through crosslinking. Photo-patternable low-k dielectric material is disclosed in U.S. Pat. Nos. 7,041,748, 7,056,840, and 6,087,064, all of which are incorporated herein by reference in their entirety. These types of photo-patternable low-k dielectric material eliminates the need for the many sacrificial materials and the corresponding plasma etching. It also dramatically reduces the steps and complexity involved in the dual damascene fabrication of metal/dielectric interconnects resulting in a speedy and cost-effective solution for manufacturing advanced ICs.

BRIEF SUMMARY OF THE DISCLOSURE

The present disclosure is drawn to an integrated circuit manufacturing apparatus and methods for its use. Provided is an integrated circuit manufacturing apparatus for forming damascene interconnecs with patternable low-k material on a wafer comprising; (1) at least one module for deposition of patternable low-k material on a wafer; (2) at least one module for uniformly heating the wafer; (3) at least one module for pattern-wise exposing of the patternable low-k material, which functions as a photoresist, to form a latent image; (4) at least one module for development of the patternable low-k material to form a relief images on the wafer; and (5) at least one module for curing the relief images to form damascene patterns as an integrated circuit interconnect; wherein all the modules are incorporated into one housing. Optionally, the apparatus may further comprise at least one module for deposition of anti-reflective layer, and/or one module for cooling or chilling the wafer.

DETAILED DESCRIPTION OF THE DISCLOSURE

Figure 1:
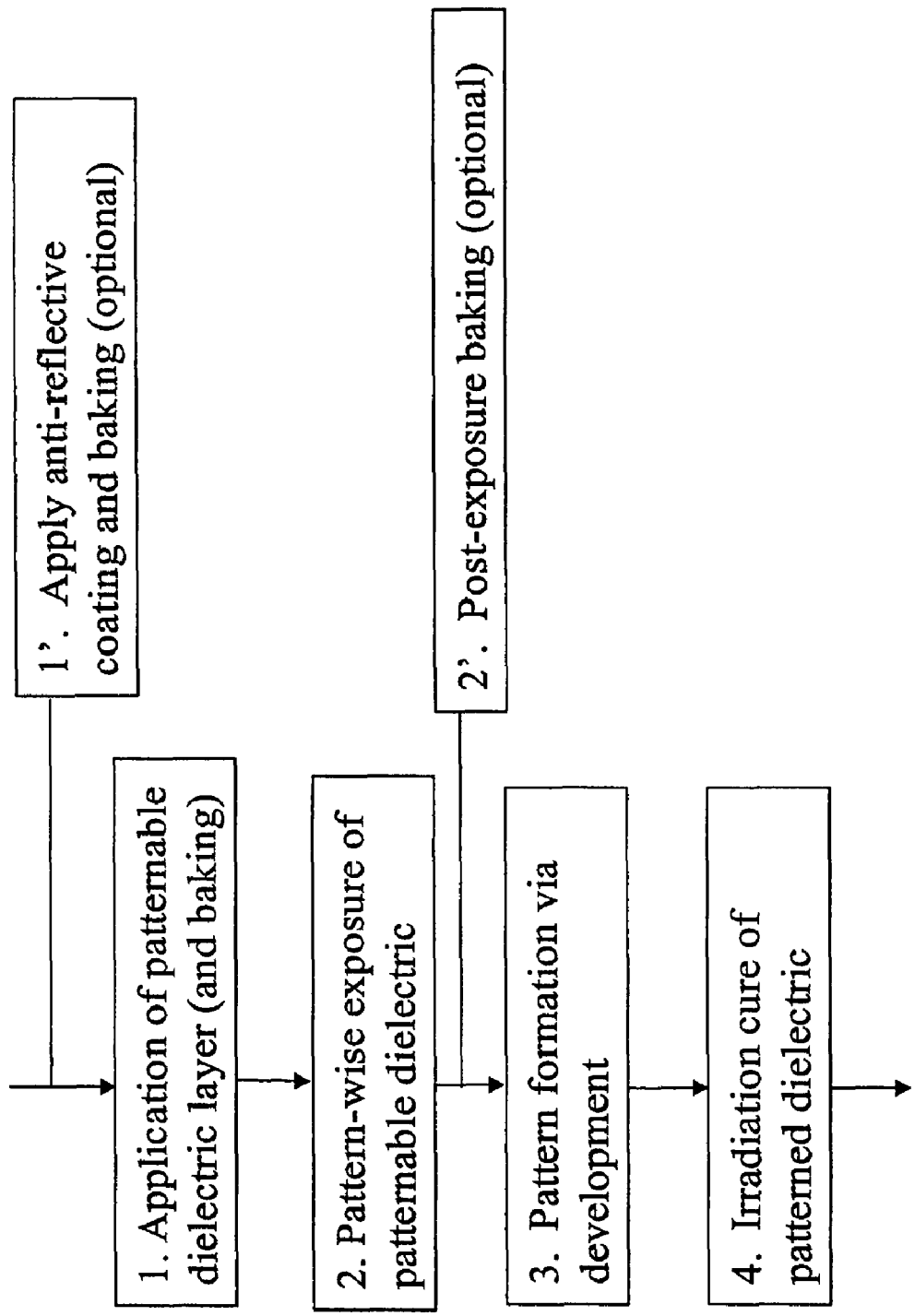
FIG. 1 is a flowchart showing a typical patterning process for fabricating a semiconductor chip having a patternable dielectric as an on-chip electrical insulator.

FIG. 1 is a flow diagram showing a fabrication process for semiconductor devices comprising a patternable dielectric as an on-chip electrical insulator. This patterning process consists of four main process steps and two optional steps. First, the patternable dielectric material is deposited on a semiconductor wafer substrate comprising a plurality of layers of electrical conductors embedded in an electrical insulator, followed by baking at appropriate temperature to remove any unwanted components. Optionally, an anti-reflective coating may be applied to the semiconductor wafer substrate prior to the deposition of the patternable low-k dielectric material.

The patternable low-k dielectric material is then pattern-wise exposed through a mask to form latent images of a desired circuitry in an exposure tool. The wafer with the latent images of the patternable low-k is then developed with a solution, typically an aqueous base solution, to form the relief image of the desired circuitry. Optionally, a post-exposure bake may be applied to effect the necessary photochemical reaction(s) for the formation of the relief image prior to the development step. Finally, the wafer with the relief images of the patternable low-k undergoes an irradiation cure step to convert the patternable dielectric into a dielectric insulator and to improve the electrical and the mechanical properties of the material. This post patterning cure can be a thermal cure, an electron beam cure, an ultra-violet (UV) cure, a plasma cure, a microwave cure, or a combination thereof. It is typically a combination of an ultra-violet (UV) cure and a thermal cure.

Figure 2:
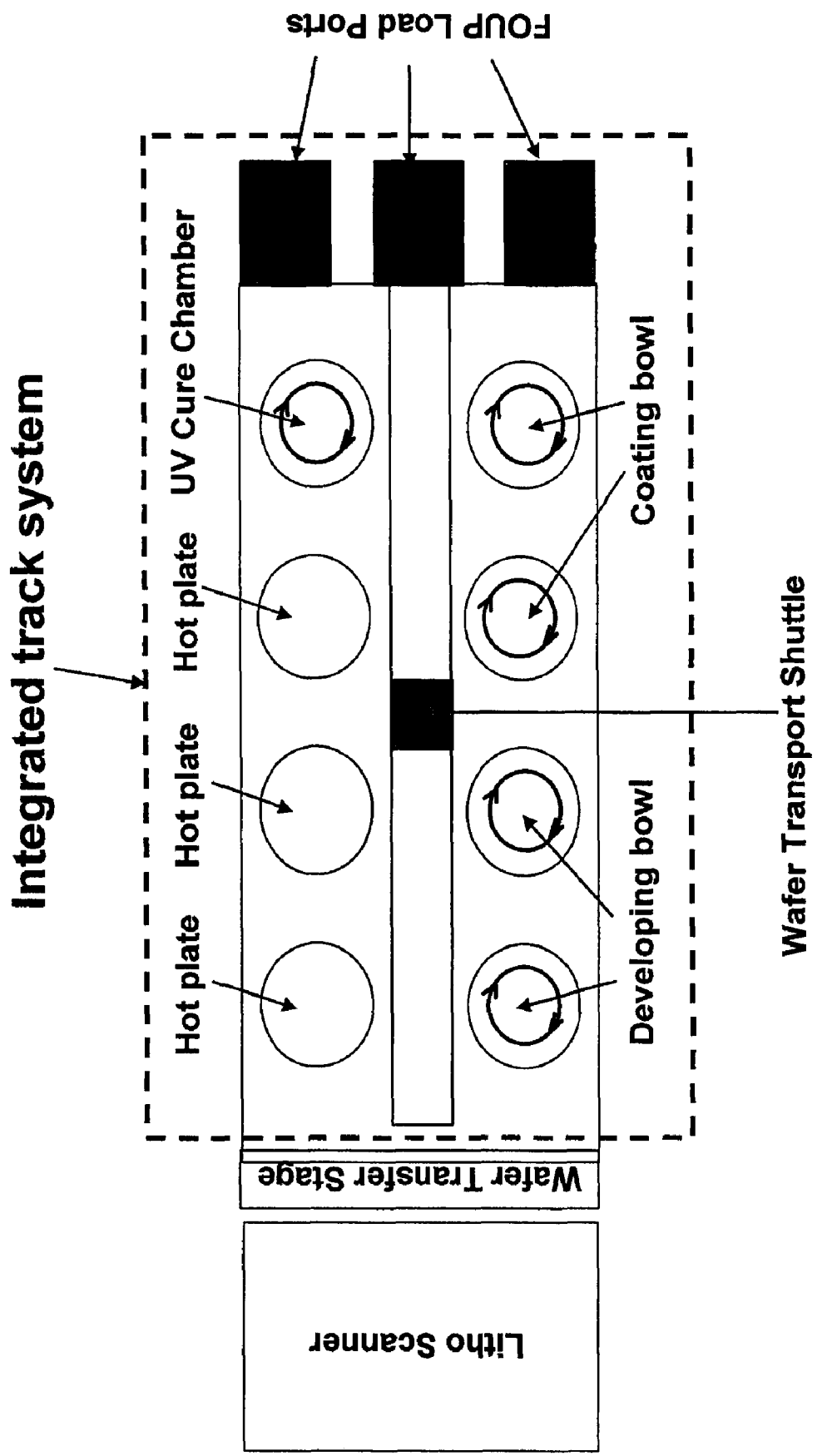
FIG. 2 illustrates integrated lithography and irradiation cure track system.

FIG. 2 illustrates an integrated circuit manufacturing system for forming damascene interconnects of patternable low-k materials on a semiconductor wafer. Front opening unified pods ("FOUP") are provided to hold the wafers securely and safely in a controlled environment and allow the wafers to be removed for processing. A wafer transport shuttle carries the wafers to each module. Initially, the wafer may be transported to a coating bowl where an anti-reflective coating is optionally applied prior to the deposition of the patternable low-k material. The wafer may then be transported to a module having a hot plate to bake the coated wafer at an appropriate temperature. Then, the wafer is taken to a coating bowl where the patternable dielectric material is deposited on the wafer. Again, the wafer may be returned to a module having a hot plate to bake the coated wafer at an appropriate temperature to remove any unwanted components such as film casting solvents and the like. The wafer is then transported with the wafer transport shuttle through the wafer transfer stage to a patterning tool, such as a lithography scanner. The patternable low-k dielectric material is then pattern-wise exposed through a mask to form latent images of a desired circuitry in an exposure tool shown as a lithography scanner in FIG. 2. A post-exposure bake may optionally be applied to effect the necessary photochemical reaction(s) for the formation of the relief image prior to the development step. The wafer with the latent images of the patternable low-k is then transferred to a module for developing with a solution, usually an aqueous base solution, to form the relief image of the desired circuitry. Finally, the wafer with the relief images of the patternable low-k is transported to a cure module, such as a UV cure chamber, to convert the patternable dielectric into a dielectric insulator and to improve the electrical and the mechanical properties of the material. This post patterning cure can be a thermal cure, an electron beam cure, an ultra-violet (UV) cure, a plasma cure, a microwave cure, or a combination thereof. In one embodiment the post patterning cure is a combination of an ultra-violet (UV) cure and a thermal cure.

Figure 3:
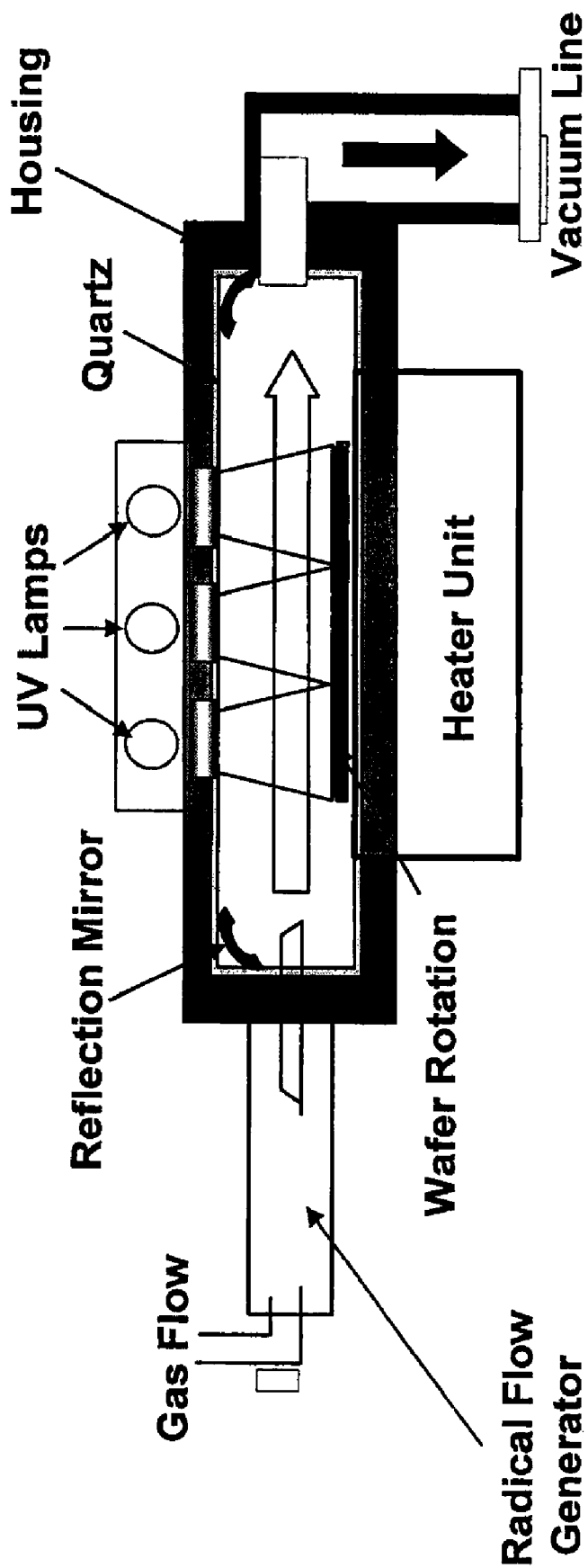
FIG. 3 shows an ultra-violet (UV) cure chamber design.

FIG. 3 shows an ultra-violet cure chamber design. One or multiple ultra-violet (UV) lamps are positioned to irradiate a wafer, which is positioned on a rotating device to ensure uniform exposure to UV rays and heat. The cure chamber may be lined with quartz and equipped with reflection mirrors positioned to concentrate the UV light rays onto the face of the wafer and to achieve UV irradiation uniformity. The cure chamber may additionally be equipped with a heater unit. The byproducts of this UV cure process are removed from the chamber either by a flow of inert gas, such as $N_2$, He, Ar or by vacuum. The UV cure chamber is designed to have very low oxygen content to avoid degradation of the resultant dielectric materials.

In one embodiment, the present disclosure is drawn to four main processing steps and two optional steps, all performed by an integrated track system comprising individual modules for different applications wherein the modules are integrated into a single housing.

A first optional step involves applying an anti-reflective coating to the semiconductor wafer substrate. In some cases, lithographic patterning cannot be performed by simply coating a wafer with a layer of photoresist, exposing and developing the photoresist and then etching the desired feature onto the wafer's surface. Instead, it is necessary to deposit at least one and some times many layer stack before the photoresist is applied. This extra layer or stack may be designed to prevent reflection of light that is transmitted through the photo-resist and reflected off the substrate and back into the photoresist, where it can interfere with incoming light and cause the resist to be unevenly exposed. The anti-reflective coatings may be either organic or inorganic. Anti-reflective films are well known to those skilled in the art and include homopolymers or copolymers of polyesters, polyimides, polyacrylates, polymethacrylates, polysulfones, amorphous carbon, and the like and may be applied by spin-on techniques, spray on techniques, dipping, etc. Inorganic anti-reflective films, such as silicon oxynitride (SiON), silicon carbide, SiC, silicon oxycarbide (SiOC), SiCOH, and siloxane, silane, carbosilane, oxycarbosilane, silsesquioxane, either as a polymer or a copolymer and may be deposited, for example, by plasma-enhanced chemical vapor deposition, spin-on techniques, dipping, etc. After applying the anti-reflective film, a post deposition baking is usually required to remove unwanted components, such as solvent, and to effect crosslinking. In one embodiment, the module for the depositing the anti-reflective layer is integrated into the apparatus of the instant disclosure.

The integrated track system of the present disclosure has a module comprising one or more coating bowls. An automated wafer transport shuttle carries the wafer from the FOUP load ports to a module where the anti-reflective coating is applied. After the anti-reflective coating is applied, the automated wafer transport shuttle can carry the wafer to the module for baking to remove unwanted components, such as solvent, and to effect crosslinking. The module for curing may comprise a hot plate, or other heating mechanism known to those skilled in the art.

A patternable dielectric material is deposited on a semiconductor wafer substrate followed by baking at an appropriate temperature, usually from about 50° C. to about 180° C., to remove any unwanted components. Examples of patternable dielectric materials useable with the present disclosure are disclosed in U.S. Pat. Nos. 7,041,748, 7,056,840, and 6,087,064, all of which are incorporated herein by reference in their entirety. These patternable dielectric materials comprise photo/acid-sensitive polymers of hydrocarbons, fluorinated hydrocarbons, siloxane, silane, carbosilane, oxycarbosilane, organosilicates, silsesquioxanes and the like. The polymers include, for example, silsesquioxane-type polymers including caged, linear, branched or combinations thereof. In one embodiment, the patternable dielectric material comprises a blend of these photo/acid-sensitive polymers.

The integrated track system of the present invention has one or more modules for applying the dielectric material. A wafer transport shuttle carries the wafer to the module(s) where the patternable dielectric material is applied by procedures such as, for example, spin-coating, spray-on, and/or dipping. Following application of the patternable dielectric material, the wafer transport shuttle carries the wafer to a module for baking. The baking generally serves to remove any unwanted components.

After the patternable low-k dielectric material is applied to the wafer, the wafer is then transported with the wafer transport shuttle through the wafer transfer stage to a module having a patterning tool, such as a lithography scanner. The patternable low-k dielectric material is then pattern-wise exposed to form latent images of a desired circuitry. The pattern-wise exposing process can be accomplished in a variety of ways, including, for example, through a mask with a lithography stepper or a scanner with an exposure light source of G-line, I-line (365 nm), DUV (248 nm, 193 nm, 157 nm), Extreme UV (13.4 nm), or an electron beam, an ion beam. The pattern-wise exposing process may also include direct writing without the use of a mask with, for example, light, electron beam, ion beam, and scanning probe lithography. Other patterning techniques include contact printing techniques such as nanoimprint lithography, nano embroising, Micro Contact Printing, replica molding, microtransfer molding, micromolding in capillaries and solvent-assisted micromolding. In one embodiment, the integrated apparatuses and process of the present disclosure are directed to the use of a patternable low-k material, which combines the functions a photoresist and low-k material into one single material. It functions as a photoresist and is converted into a low-k material during post patterning processing, by heat, UV light, electron beam, ion beam, microwave, plasma cure, thermal cure or combinations thereof. For instance, the patternable low-k material may comprise a functionalized polymer having one or more acid-sensitive imageable groups. These polymers or blends of polymers can be converted into low-k polymers after subsequent processing. More specifically, the patternable low-k material comprises photo/acid-sensitive polymers of hydrocarbons, fluorinated hydrocarbons, siloxane, silane, carbosilane, oxycarbosilane, organosilicates, silsesquioxanes and the like. The polymers include, for example, silsesquioxane-type polymers including caged, linear, branched or combinations thereof. In one embodiment, the patternable dielectric material comprises a blend of these photo/acid-sensitive polymers. In another embodiment, the patternable dielectric material comprises a blend of these photo/acid-sensitive polymers. Examples of patternable dielectric materials useable with the present disclosure are disclosed in U.S. Pat. Nos. 7,041,748, 7,056,840, and 6,087,064, all of which are incorporated herein by reference in their entirety. The dielectric constant of the patternable low-k material after cure is generally no more than 4.3. The dielectric constant may be between one and up to about 4.3, from about 1.0 to about 3.5, from about 1.0 to about 3, or from about 1.0 to about 2.

A second optional step involves a post-exposure baking. In some cases, it may be necessary to effect the necessary photochemical reaction(s) for the formation of the relief image prior to development. The wafer transport shuttle carries the wafer to a module for post-exposure baking, wherein the baking process can take many forms. For instance, baking may be realized using a hot plate, or other heating device known in the art.

The wafer with the latent images of the patternable low-k material is then transported to a module to be developed with a solution, usually an aqueous base solution, to form the relief image of the desired circuitry. Developing solutions are well known in the art and include, for example, tetramethyl ammonium hydroxide (TMAH).

Finally, the integrated track system transports the wafer to a module to undergo an irradiation cure step. The wafer with the relief images of the patternable low-k undergoes an irradiation cure step to convert the patternable dielectric into a dielectric insulator and to improve the electrical and the mechanical properties of the material. In one embodiment, the irradiation cure step is performed by a thermal cure, an electron beam cure, an ultra-violet (UV) cure, an ion beam, a plasma cure, a microwave cure or a combination thereof. In another embodiment, the irradiation cure step is performed by a combination of a thermal cure and an ultra-violet (UV) cure wherein the wavelength of the ultra-violet (UV) light is from about 50 nm to about 300 nm and the light source for the ultra-violet (UV) cure is a UV lamp, an excimer (exciplex) laser or a combination thereof. The excimer laser may be generated from at least on of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range of about 50 nm to about 300 nm. Additionally, the light of the ultra-violet (UV) cure may be enhanced and/or diffused with a lens or other optical diffusing device known to those skilled in the art.

Typically, the module for curing the patternable low-k material is compact in size so that it fits into the track system without significant increasing its foot print.

In another embodiment, the integrated track system of the present disclosure further comprises a cooling module to cool the wafers between processing steps. For instance, the cooling module can be used to cool the wafer after either baking or curing of the wafer films.

The integrated track system is arranged to maximize efficiency and minimize defects. The different modules may be arranged in any number of ways. For instance, the modules may be positioned adjacent to or stacked upon one another. The wafer transport shuttle is configured to move the wafers between the modules where they are processed.

The integrated track system can be computerized, i.e. programmable to control temperatures, processing times, film thickness, etc. Thus, the integrated track system is multipurpose in that it is capable of processing a variety of wafer types in a variety of ways.

It is important to note that the construction and arrangement of the apparatuses and methods provided herewith and in exemplary embodiments is illustrative only. Although only a few embodiments of the present disclosure have been described in detail, those skilled in the art will readily appreciate that many modifications are possible (e.g. variations in sizes, dimensions, structures, shapes and proportions of the various elements, values of parameters, mounting arrangements, use of materials, colors, orientation, etc.) without materially departing from the novel teachings and advantages of the subject matter recited in the claims. Accordingly, all such modifications are intended to be included within the scope of the present disclosure as defined in the appended claims. The order or sequence of any process or method steps may be varied or re-sequenced according to alternative embodiments. Other substitution, modification, changes and omissions may be made in the design, operating conditions and arrangement of the embodiments without departing from the spirit of the present disclosure as expressed in the appended claims.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

All publications, patents and patent applications cited in this specification are herein incorporated by reference, and for any and all purposes, as if each individual publication, patent or patent application were specifically and individually indicates to be incorporated by reference. In this case of inconsistencies, the present disclosure will prevail.

What is claimed as new and desired to be protected by Letters Patent of the United States is:

1. An integrated circuit manufacturing apparatus for forming damascene interconnects of patternable low-k material on a wafer comprising:
   at least one module for deposition of patternable low-k material on a semiconductor wafer;
   at least one module for uniformly heating the wafer;
   at least one module for pattern-wise exposure of the patternable low-k material on the semiconductor wafer;
   at least one module for developing the exposed wafer to form relief images; and
   at least one module for curing the relief images to form an on-chip damascene structure as part of integrated circuit interconnect;
   wherein all modules are integrated into a single housing.

2. The apparatus of claim 1 further comprising at least one chill module to cool the wafer.

3. The apparatus of claim 1 further comprising at least one module for deposition of anti-reflective layer on a semiconductor wafer prior to the deposition of the patternable low-k material.

4. The apparatus of claim 1 wherein the patternable low-k material functions as a photoresist.

5. The apparatus of claim 1 wherein the curing of the relief images of the patternable low-k material comprises a thermal cure, an electron beam cure, an ultra-violet cure, a plasma cure, a microwave cure, or a combination thereof.

6. The apparatus of claim 1 wherein the byproducts of the cure process are removed by an inert gas, such as $N_2$, He, Ar or by a vacuum.

7. The apparatus of claim 5 wherein the cured patternable low-k material has a dielectric constant of no more than 4.3.

8. The apparatus of claim 5 wherein the curing of the relief images of the patternable low-k material comprises a combination of a thermal cure and an ultra-violet (UV) cure.

9. The apparatus of claim 8 wherein the wavelength of the UV light is from about 50 nm to about 300 nm and the light source for the ultra-violet (UV) cure is a UV lamp, an excimer laser or a combination thereof.

10. The apparatus of claim 8 wherein light of the ultra-violet (UV) cure is enhanced and/or diffused with a lens, mirrors, optical diffusing elements, or combinations thereof.

11. The apparatus of claim 9 wherein the excimer laser is generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range of about 50 nm to about 300 nm.

12. A method for forming damascene interconnects of patternable low-k material on a wafer comprising:
   depositing a patternable low-k material on a semiconductor wafer;
   uniformly heating the wafer;
   pattern-wise exposing the patternable low-k material on the semiconductor wafer;
   developing the exposed wafer to form relief images of patternable low-k material; and
   curing the relief images of the patternable low-k material to form an on-chip damascene structure as part of an integrated circuit interconnect; wherein, all these steps are performed in a single housing.

13. The method of claim 12 further comprising depositing an anti-reflective layer on a semiconductor wafer prior to the deposition of the patternable low-k material.

14. The method of claim 12 wherein the curing of the relief images of the patternable low-k material comprises a thermal cure, an electron beam cure, an ultra-violet cure, a plasma cure, a microwave cure, or a combination thereof.

15. The method of claim 12 wherein the curing of the relief images of the patternable low-k material comprises a combination of thermal cure and UV cure.

16. The method of claim 14 wherein the cured patternable low-k material has a dielectric constant of no more than 4.3.

17. The method of claim 15 wherein the wavelength of the UV light is from about 50 nm to about 300 nm and the light source for the ultra-violet (UV) cure is a UV lamp, an excimer laser or a combination thereof.

18. The method of claim 17 wherein the excimer laser is generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range of about 50 nm to about 300 nm.

19. The method of 17 wherein light of the ultra-violet (UV) cure is enhanced and/or diffused with a lens, mirrors, optical diffusing elements, or combinations thereof.

20. An integrated circuit manufacturing apparatus for forming on-chip damascene interconnects of patternable low-k material on a wafer comprising:
   at least one module for the optional deposition of an anti-reflective layer on a semiconductor wafer prior to the deposition of the patternable low-k material;
   at least one module for deposition of patternable low-k material on a semiconductor wafer;
   at least one module for uniformly heating the wafer;
   at least one module for lithographic pattern-wise exposure of the patternable low-k material through a mask on the semiconductor wafer, wherein the module comprises a lithography stepper or scanner;
   at least one module for developing the exposed wafer to form relief images, wherein the module uses an aqueous base solution as a developer;
   at least one module for curing the relief images of the patternable low-k material with a thermal cure, an electron beam cure, an ultra-violet cure, a plasma cure, a microwave cure, or a combination thereof, to form an on-chip damascene structure as part of an integrated circuit interconnect;
   at least one chill module to cool the wafer; and
   a wafer transport shuttle that carries the wafer to each module;
   wherein all modules are integrated into a single housing.

21. The apparatus according to claim 20 further comprising front opening unified pods.

* * * * *